United States Patent
Liau et al.

(10) Patent No.: US 8,017,941 B2
(45) Date of Patent: Sep. 13, 2011

(54) CERAMIC MESFET DEVICE AND MANUFACTURING METHOD THEREOF

(75) Inventors: Chau-Kuang Liau, Jhongli (TW); Wen-Wei Chou, Bade (TW)

(73) Assignee: Yuan Ze University, Taoyuan County (TW)

( * ) Notice: Subject to any disclaimer, the term of this patent is extended or adjusted under 35 U.S.C. 154(b) by 402 days.

(21) Appl. No.: 12/289,485

(22) Filed: Oct. 29, 2008

(65) Prior Publication Data
US 2009/0194765 A1 Aug. 6, 2009

(30) Foreign Application Priority Data
Feb. 5, 2008 (TW) .............................. 97104511 A

(51) Int. Cl.
*H01L 51/30* (2006.01)
(52) U.S. Cl. .................. 257/40; 257/43; 257/E51.027
(58) Field of Classification Search ............ 257/43, 257/E51.027, 40
See application file for complete search history.

(56) References Cited

U.S. PATENT DOCUMENTS
2001/0022381 A1* 9/2001 Gonzalez et al. ............ 257/410
2002/0160553 A1* 10/2002 Yamanaka et al. ............ 438/149
2008/0149922 A1* 6/2008 Lin et al. ..................... 257/40
2009/0267058 A1* 10/2009 Namdas et al. .............. 257/40

FOREIGN PATENT DOCUMENTS
| TW | 92105598 | 3/2003 |
| TW | 94109677 | 3/2005 |
| TW | 96100279 | 1/2007 |

* cited by examiner

*Primary Examiner* — Thao X Le
*Assistant Examiner* — Geoffrey Ida
(74) *Attorney, Agent, or Firm* — Rosenberg, Klein & Lee

(57) ABSTRACT

A method of manufacturing a MESFET using ceramic materials includes providing a substrate; providing a ceramic semiconductor material to apply onto the substrate to form a first ceramic semiconductor layer; providing a ceramic semiconductor material which is blended with ions, wherein the ceramic semiconductor material is applied onto a central part of the first ceramic semiconductor layer to form a second ceramic semiconductor layer with ions; providing another ion-mixed ceramic semiconductor material is provided to apply over both sides of the first ceramic semiconductor layer to form a third ceramic semiconductor layer having ions; and respectively plating the second and third ceramic semiconductor layers with metal layers so that the second ceramic semiconductor layer has a gate electrode and the third ceramic semiconductor layer has a source and a drain. A transistor obtained by this method can be put into broader range of applications compared to III-V group transistor.

20 Claims, 5 Drawing Sheets

US 8,017,941 B2

CERAMIC MESFET DEVICE AND MANUFACTURING METHOD THEREOF

BACKGROUND OF THE INVENTION

1. Field of the Invention

The invention generally relates to a semiconductor device, and more particularly to a metal semiconductor field effect transistor (MESFET) device with Schottky junction and a method of manufacturing thereof.

2. Description of Related Art

MESFETs are based on elements of the III-V groups, such as Ga and As, and have a Schottky junction after being processed by semiconductor technology. A conventional MESFET has a source and a drain, which are formed by the Schottky junction to transmit signals. A metal layer is between the source and drain to form a gate electrode which controls the voltage between the source and the drain so as to transmit the signals from the source to the drain. For example, TW application Ser. No. 96100279, TW application Ser. No. 94109677 and TW application Ser. No. 92105598 disclose the relevant theory and structures.

Current methods of manufacturing MESFET use elements of groups III-V as a basis. III-V group elements are good semiconductor materials. However, compared to ceramic, III-V group elements have inherent restrictions on its physical and chemical properties. For example, III-V group is not so good at corrosion resistance, scratch resistance and high-frequency application.

Therefore, there is a need of improving physical and chemical properties of MESFET device while lowering production cost.

SUMMARY OF THE INVENTION

It is one object of the invention to provide a metal semiconductor field effect transistor using ceramics and a method of manufacturing a metal semiconductor field effect transistor with lower production cost and simpler procedures.

In order to achieve the above and other objectives of the invention, the method of manufacturing a metal semiconductor field effect transistor using ceramics includes providing a substrate; providing a ceramic semiconductor material to apply onto the substrate to form a first ceramic semiconductor layer; providing a ceramic semiconductor material which is blended with ions, wherein the ceramic semiconductor material is applied onto a central part of the first ceramic semiconductor layer to form a second ceramic semiconductor layer with ions; providing another ion-mixed ceramic semiconductor material is provided to apply over both sides of the first ceramic semiconductor layer to form a third ceramic semiconductor layer having ions; and respectively plating the second and third ceramic semiconductor layers with metal layers so that the second ceramic semiconductor layer has a gate electrode and the third ceramic semiconductor layer has a source and a drain.

In another aspect, the metal semiconductor field effect transistor device of the invention includes a substrate; a first ceramic semiconductor layer, formed on the substrate; a second ceramic semiconductor layer, having ions and formed on a center of the first ceramic semiconductor layer; a third ceramic semiconductor layer, having ions and formed on both sides of the first ceramic semiconductor layer, and a plurality of metal layers, respectively formed on the second and third ceramic semiconductor layers so that the second ceramic semiconductor layer has a gate electrode and the third ceramic semiconductor layer has a source and drain.

To provide a further understanding of the invention, the following detailed description illustrates embodiments and examples of the invention, this detailed description being provided only for illustration of the invention.

DETAILED DESCRIPTION OF PREFERRED EMBODIMENTS

Figure 1:
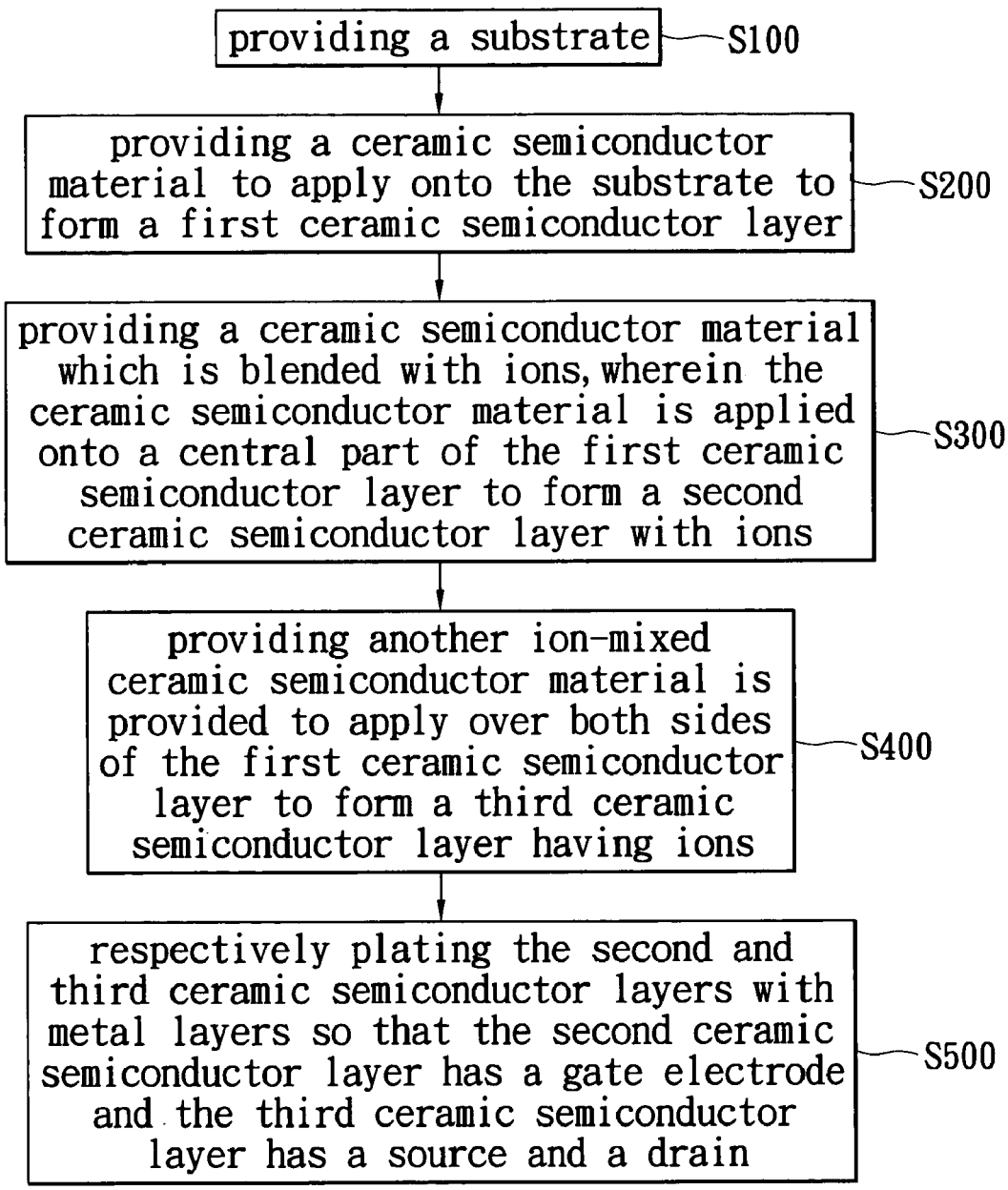
FIG. 1 is a flow chart of a method of manufacturing a ceramic MESFET device according to one embodiment of the invention.
Figure 2:
FIG. 2 is a schematic view of a substrate according to one embodiment of the invention.
Figure 3:
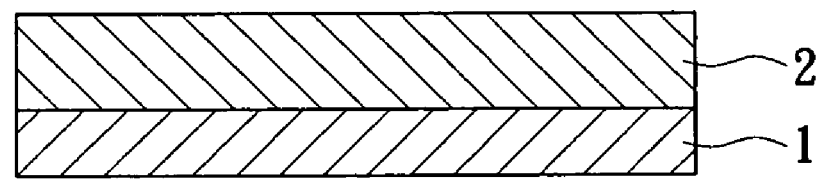
FIG. 3 is a schematic view of a substrate and a first ceramic semiconductor layer according to one embodiment of the invention.
Figure 4:
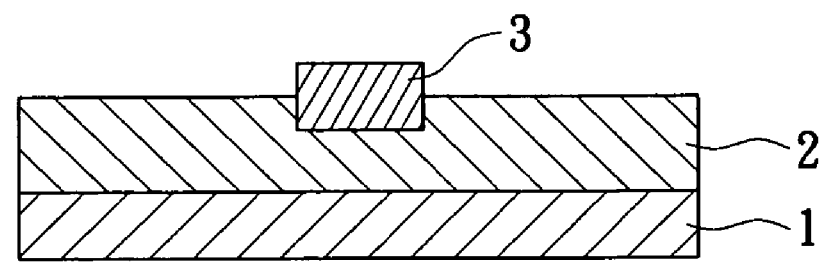
FIG. 4 is a schematic view of a substrate, a first ceramic semiconductor layer and a second ceramic semiconductor layer according to one embodiment of the invention.
Figure 5:
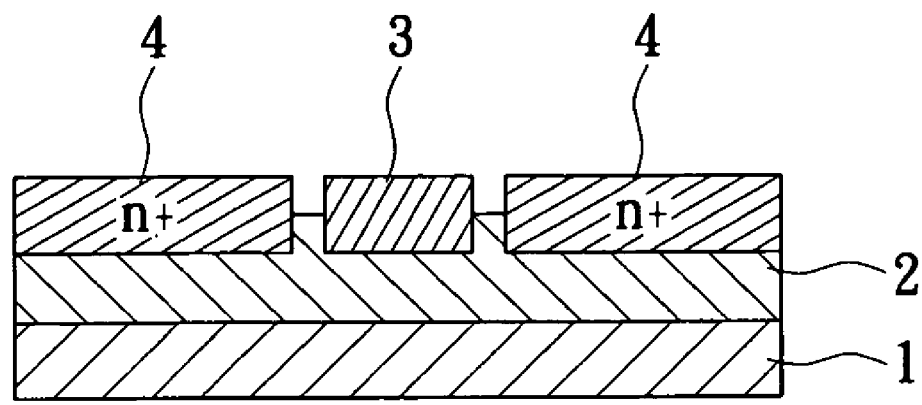
FIG. 5 is a schematic view of a substrate, a first ceramic semiconductor layer, a second ceramic semiconductor layer and a third ceramic semiconductor layer according to one embodiment of the invention.
Figure 6:
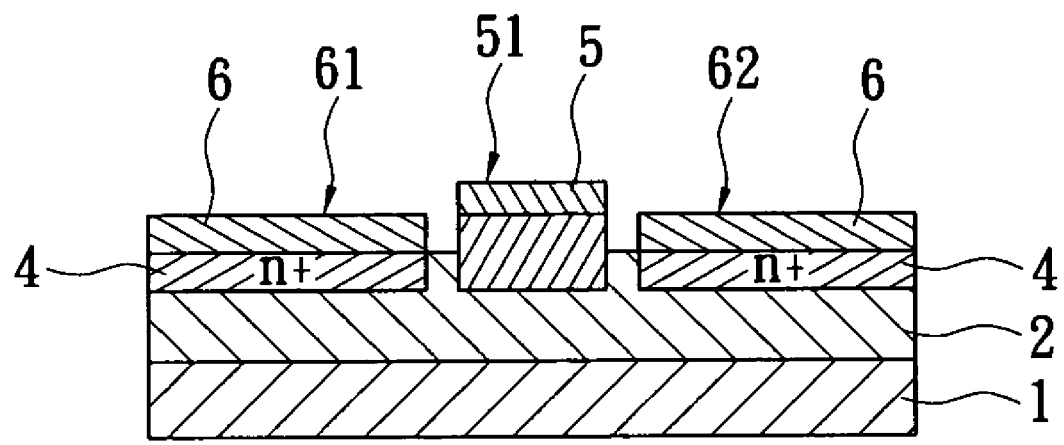
FIG. 6 is a schematic view of a substrate, a first ceramic semiconductor layer, a second ceramic semiconductor layer, a third ceramic semiconductor layer and a metal layer according to one embodiment of the invention.

Wherever possible in the following description, like reference numerals will refer to like elements and parts unless otherwise illustrated.

FIG. 1 is a flow chart of a method of manufacturing a ceramic MESFET device according to one embodiment of the invention. FIG. 2 through FIG. 6 show the process of manufacturing a ceramic MESFET device according to one embodiment of the invention. The method of manufacturing the ceramic MESFET device includes steps as follows.

(S100) A substrate 1 is provided. The substrate 1 can be made any known or unknown conductor materials such as indium tin oxide (ITO)-based glass or traditional glass.

(S200) A ceramic semiconductor material is provided. The ceramic material is applied onto the substrate 1 to form a first ceramic semiconductor layer 2.

The above ceramic semiconductor material can be made by gas congregation, metallurgy, chemical reduction or sol-gel method, for example. In the case using sol-gel method, the first ceramic semiconductor layer 2 includes ceramic particles with nano ($10^{-9}$m)-level metal oxide, polymeric adhesives and solvents.

The above metal oxide is selected from at least one of $TiO_2$, ZnO, $SnO_2$, $Fe_2O_3$, and NiO. Preferably, the metal oxide is $TiO_2$. The solvent can be alcohol, for example. The polymeric adhesive can be, but not limited to, Poly (vinyl butyral) (PVB), Poly (methyl methacrylate) (PMMA) or Poly (vinyl alcohol) (PVA). Preferably, the solvent is PVB.

The ceramic particles and the polymeric adhesives are mixed with the solvent at a predetermined weight percent. For example, 1 g of $TiO_2$ particles, 0.06 g of polymeric adhesive, 7.5 ml of alcohol and 2.5 ml of water are mixed thoroughly to obtain the ceramic semiconductor material. The obtained ceramic semiconductor material is then applied onto the substrate. After sintering, a first ceramic semiconductor layer 2 is formed. The sintering temperature is about 475° C.

(S300) A ceramic semiconductor material which is blended with ions is provided. This ceramic semiconductor material is applied onto a central part of the first ceramic semiconductor layer 2 to form a second ceramic semiconductor layer 3 with ions.

The above ion-blended ceramic semiconductor material is made in the same manner as the above ceramic semiconductor material. For the sol-gel as example, the second ceramic semiconductor layer 3 includes ceramic particles with nano-level metal oxides, ions, polymeric adhesive and solvents.

The metal oxides can be those metal oxides mentioned above. Preferably, it can be $TiO_2$. The solvent can be alcohol. The polymeric adhesive can be the same as those mentioned above. The ions can be $Fe^{3+}$, $Ag^+$, or $Zn^{2+}$, for example.

The ions are mixed with the ceramic particles, and the polymeric adhesive is mixed with the solvent at a predetermined weight percentage to form an ion ceramic semiconductor material which is then applied onto a central part of the first ceramic semiconductor layer 2. After sintering, the ion-blended ceramic semiconductor material is cured as the second ceramic semiconductor layer 3. Dislike the first ceramic semiconductor layer 2, the second ceramic semiconductor layer 3 is an ion-mixed semiconductor layer.

(S400) Another ion-mixed ceramic semiconductor material is provided to apply over both sides of the first ceramic semiconductor layer 2 to form a third ceramic semiconductor layer ($n^+$) 4 having ions.

At this step, the third ceramic semiconductor layer 4 can be formed by the same technology as the second ceramic semiconductor layer 3. That is those ions used for the third ceramic semiconductor layer 4 can be different from or the same with those used for the second ceramic semiconductor layer 3. In the embodiment, the ions used in the second ceramic semiconductor layer 3 are $Fe^{3+}$ and the ions used in the third ceramic semiconductor layer 4 are $Zn^{2+}$. However, ions are not particularly limited to those mentioned above. Equivalent ions can be used and within the scope of the invention.

The ion ceramic semiconductor material is applied onto the first ceramic semiconductor layer 2 and then sintered. During sintering, the ions are implanted beneath an upper surface of the first ceramic semiconductor layer 2 to form a pair of Schottky junctions in the semiconductor areas.

(S500) The second and third ceramic semiconductor layers 3, 4 having ions are respectively plated with metal layers 5, 6 so that the second ceramic semiconductor layer 3 has a gate electrode 51 and the third ceramic semiconductor layer 4 has a source 61 and a drain 62, thereby forming a MESFET device having Schottky junctions.

The MESFET device according to one embodiment of the invention includes a substrate 1, a first ceramic semiconductor layer 2 formed on the substrate 1, a second ceramic semiconductor layer 3 having ions and extruding from a center of the first ceramic semiconductor layer 2, a third ceramic semiconductor layer 4 having ions different from second ceramic semiconductor layer 4 and formed on both sides of the first ceramic semiconductor layer 2, and a plurality of metal layers 5, 6 respectively formed on the second and third ceramic semiconductor layers 3, 4, a gate electrode 51 formed on the second ceramic semiconductor layer 3, and a source 61 and drain 62 formed on the third ceramic semiconductor layer 4.

As for the compositions of the first ceramic semiconductor layer 2, the second ceramic semiconductor layer 3 and the third ceramic semiconductor layer 4, please refer to the relevant passages above.

Figure 7:
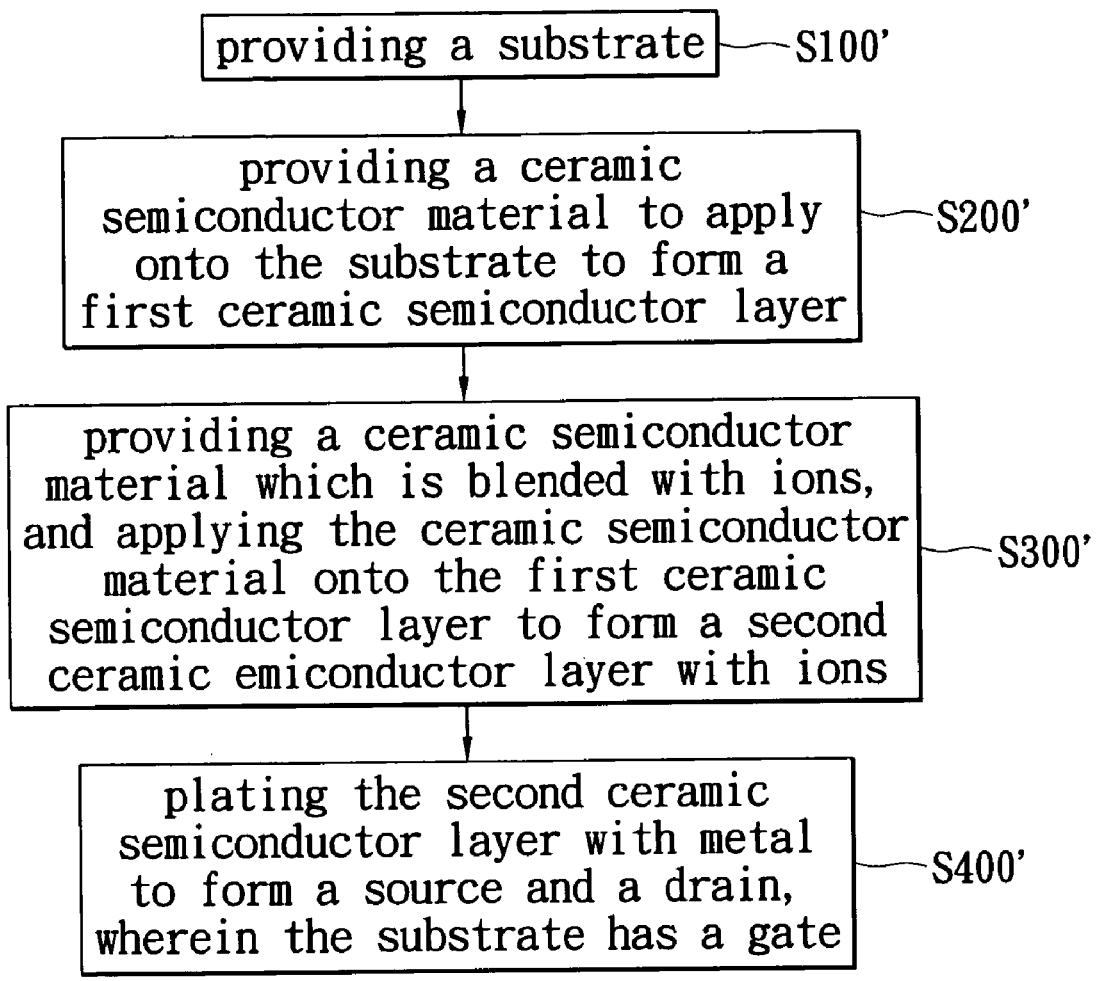
FIG. 7 is a flow chart of a method of manufacturing a ceramic MESFET device according to another embodiment of the invention.
Figure 8:
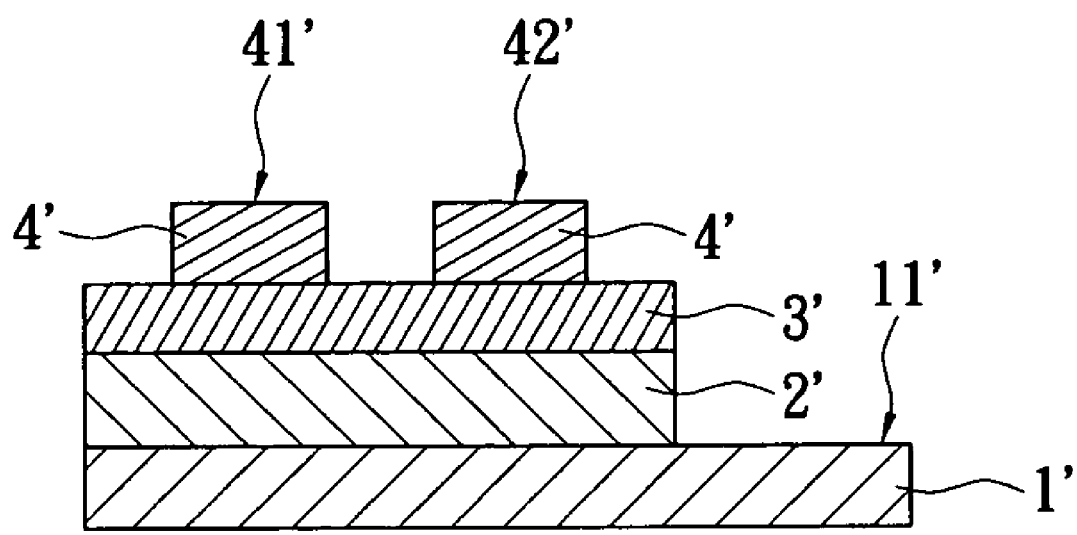
FIG. 8 is a schematic view of a substrate, a first ceramic semiconductor layer, a second ceramic semiconductor layer and a metal layer according to another embodiment of the invention.

Referring to FIG. 7 and FIG. 8, the method of manufacturing the MESFET device according to another embodiment:

(S100') A substrate 1' is provided, wherein the substrate is an electrical conductive glass.

(S200') a ceramic semiconductor material is provided to apply over the substrate to form a first ceramic semiconductor layer 2'.

(S300') An ion-mixed ceramic semiconductor material is provided to apply on the first ceramic semiconductor layer 2' to form a second ceramic semiconductor layer 3' having ions.

(S400') Two metal layers 4 are plated over the second ceramic semiconductor layer 3' so that the second ceramic semiconductor layer 3' has a source 41' and a drain 42'. The substrate 1' has a gate electrode 11'. In this embodiment, the ceramic semiconductor material and the ion-mixed ceramic semiconductor material are made in the same manner as in the above embodiment. The ions used for respective layers in this embodiment are the same as in the above embodiment.

Accordingly, a ceramic semiconductor material is coated on the substrate of electrical conductive glass (i.e. gate) that is known as the first ceramic semiconductor layer 2' and another ceramic semiconductor material is coated on the first ceramic semiconductor layer 2' to form second ceramic semiconductor layer 3'. Then, metal layer is respectively deposited on the separated parts of the second ceramic semiconductor layer 3' to form source and drain. For example, the detail steps are as the following.

1. cleaning the electrical conductive glass by DI water and covering a half of the electrical conductive glass in order to manufacture the thin-film coating area (1.5 cm*1.3 cm).

2. coating a solution of $TiO_2$ (ceramic semiconductor material) on the electrical conductive glass by spin coating means. Then, preheating the electrical conductive glass at 60° C. in 30 minutes. Sintering the electrical conductive glass at 475° C. in 1 hour to obtain an electrode of $TiO_2$ (the thickness of the thin-film of is $TiO_2$ about 2.20 µm).

3. dropping the solution of $TiO_2$ with doping ion on the glass and spinning the electrical conductive glass for coating the solution of $TiO_2$ with doping ion (i.e. the ceramic semiconductor material with doping ion) and preheating the electrical conductive glass at 60° C. in 30 minutes. Then, sintering the electrical conductive glass at 475° C. in 1 hour to obtain an electrode of $TiO_2$ (the thickness of the thin-film of $TiO_2$ with doping ion is about 1.26 µm).

4. separating the layer of layer of $TiO_2$ with doping ion into two parts. Coating the metal layer (Au or Pt) on the two parts respectively is produced to form the source and drain. The other half of the electrical conductive glass without thin-film is gate.

The MESFET device in another embodiment of the invention includes a substrate 1', a first ceramic semiconductor layer 2' formed on the substrate 1', a second ceramic semiconductor layer 3' formed on the first ceramic semiconductor layer 2', and two metal layers 4' formed on the second ceramic semiconductor layer 3', so that the second ceramic semiconductor layer 3' has a source 41', a drain 42' and the substrate 1' has a gate electrode 11'.

In light of the above, the ceramic semiconductor is processed to obtain a ceramic semiconductor device with Schottky junctions. Compared to the conventional semiconductor device which uses III-V group elements to form Schottky junctions, the MESFET device of invention has different physical and chemical properties from III-V group device.

Therefore, the device of the invention can be applied to wide range of application can be expanded, obtained with simplified procedures and lowered cost. The superior properties of ceramic help modify the physical and chemical properties such as corrosion resistance and scratch resistance of the MESFET device, and also increase the possibility of high-frequency application. Therefore the device of the invention can be put into practice within broadened range of application. It is preferable to use $TiO_2$ because $TiO_2$ can be processed at lower temperature with lower cost. However, other similar substances such as ZnO, $SnO_2$, $Fe_2O_3$, and NiO can be used as well. Thereby, the MESFET device of the invention can be obtained with lower cost and simpler production.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method of manufacturing a metal semiconductor field effect transistor (MESFET) using ceramic materials, comprising:
   providing a substrate;
   providing a ceramic semiconductor material to apply onto the substrate to form a first ceramic semiconductor layer;
   providing a ceramic semiconductor material which is blended with ions, wherein the ceramic semiconductor material is applied onto a central part of the first ceramic semiconductor layer to form a second ceramic semiconductor layer with ions;
   providing another ion-mixed ceramic semiconductor material to apply on both sides of the first ceramic semiconductor layer to form a third ceramic semiconductor layer having ions; and
   respectively plating the second and third ceramic semiconductor layers with metal layers so that the second ceramic semiconductor layer has a gate electrode and the third ceramic semiconductor layer has a source and a drain.

2. The method of manufacturing a metal semiconductor field effect transistor (MESFET) using ceramic materials of claim 1, wherein the ceramic semiconductor material is made using sol-gel method, and the ceramic semiconductor material comprises ceramic particles with nano-level metal oxide, polymeric adhesives and solvents.

3. The method of manufacturing metal semiconductor field effect transistor (MESFET) using ceramic materials of claim 2, wherein the metal oxide is selected from at least one of $TiO_2$, ZnO, $SnO_2$, $Fe_2O_3$, and NiO.

4. The method of manufacturing a metal semiconductor field effect transistor (MESFET) using ceramic materials of claim 1, wherein the second and third ceramic semiconductor materials are made using the sol-gel method, and the ion-mixed ceramic semiconductor materials comprise ceramic particles with nano-level metal oxide, ions, polymeric adhesives and solvents, wherein the ceramic particles are mixed with the ions and the polymeric adhesive is mixed with the solvent.

5. The method of manufacturing metal semiconductor field effect transistor (MESFET) using ceramic materials of claim 4, wherein the ions are $Fe^{3+}$, $Ag^+$, or $Zn^{2+}$, and the ions used in the second ceramic semiconductor layer are different from or the same with those used in the third ceramic semiconductor layer.

6. The method of manufacturing a metal semiconductor field effect transistor (MESFET) using ceramic materials of claim 4, wherein the metal oxide is selected from at least one of $TiO_2$, ZnO, $SnO_2$, $Fe_2O_3$, and NiO.

7. A metal semiconductor field effect transistor (MESFET) device, comprising:
   a substrate;
   a first ceramic semiconductor layer, formed on the substrate;
   a second ceramic semiconductor layer, having ions and formed on a center of the first ceramic semiconductor layer,
   a third ceramic semiconductor layer, formed on both sides of the first ceramic semiconductor layer, and
   a plurality of metal layers, respectively formed on the second and third ceramic semiconductor layer so that the second ceramic semiconductor has a gate thereon and the third ceramic semiconductor layer has a source and a drain thereon.

8. The metal semiconductor field effect transistor (MESFET) device of claim 7, wherein the first, second and third ceramic semiconductor layers comprise ceramic particles with nano-level metal oxide.

9. The metal semiconductor field effect transistor (MESFET) device of claim 8, wherein the metal oxide is selected from at least one of $TiO_2$, ZnO, $SnO_2$, $Fe_2O_3$, and NiO.

10. The metal semiconductor field effect transistor (MESFET) device of claim 7, wherein the ions are $Fe^{3+}$, $Ag^+$, or $Zn^{2+}$, and the ions used in the second ceramic semiconductor layer is different from or the same with those used in the third ceramic semiconductor layer.

11. A method of manufacturing a metal semiconductor field effect transistor (MESFET) using ceramic materials, comprising:
   providing a substrate;
   providing a ceramic semiconductor material to apply onto the substrate to form a first ceramic semiconductor layer;
   providing a ceramic semiconductor material which is blended with ions, and applying the ceramic semiconductor material onto the first ceramic semiconductor layer to form a second ceramic semiconductor layer with ions; and
   plating the second ceramic semiconductor layer with metal layers to form a source and a drain thereon, wherein the substrate has a gate electrode.

12. The method of manufacturing a metal semiconductor field effect transistor (MESFET) using ceramic materials of claim 11, wherein the substrate is an electrically conductive glass.

13. The metal semiconductor field effect transistor (MESFET) device of claim 11, wherein the ceramic semiconductor material for the first ceramic semiconductor layer is made using the sol-gel method, and the ceramic semiconductor material comprises ceramic particles with nano-level metal oxide, polymeric adhesives and solvents, and the polymeric adhesive is mixed with the solvent.

14. The method of manufacturing a metal semiconductor field effect transistor (MESFET) using ceramic materials of claim 13, wherein the metal oxide is selected from at least one of $TiO_2$, ZnO, $SnO_2$, $Fe_2O_3$, and NiO.

15. The method of manufacturing a metal semiconductor field effect transistor (MESFET) using ceramic materials of claim 11, wherein the second ceramic semiconductor materials is made using the sol-gel method, and the ion-mixed ceramic semiconductor material comprises ceramic particles with nano-level metal oxide, ions, polymeric adhesives and solvents, and the ceramic particles are mixed with the ions and the polymeric adhesive is mixed with the solvent.

16. The method of manufacturing a metal semiconductor field effect transistor (MESFET) using ceramic materials of claim 15, wherein the ions are $Fe^{3+}$, $Ag^+$, or $Zn^{2+}$.

17. A metal semiconductor field effect transistor (MESFET) device using ceramics, comprising:
- a substrate, having a gate electrode;
- a first ceramic semiconductor layer, formed on the substrate;
- a second ceramic semiconductor layer, having ions and formed on the first ceramic semiconductor layer; and
- two metal layers, formed on the second ceramic semiconductor layer so that a source and a drain are formed thereon.

18. The metal semiconductor field effect transistor (MESFET) device using ceramics of claim 17, wherein the first and second ceramic semiconductor layers comprise ceramic particles with nano-level metal oxide.

19. The metal semiconductor field effect transistor (MESFET) device using ceramics of claim 18, wherein the metal oxide is selected from at least one of $TiO_2$, $ZnO$, $SnO_2$, $Fe_2O_3$, and $NiO$.

20. The metal semiconductor field effect transistor (MESFET) device using ceramics of claim 17, wherein the ions used in the second ceramic semiconductor layer are $Fe^{3+}$, $Ag^+$, or $Zn^{2+}$.

* * * * *